United States Patent
Uesugi et al.

(10) Patent No.: US 9,231,160 B1
(45) Date of Patent: Jan. 5, 2016

(54) SEMICONDUCTOR LIGHT EMITTING ELEMENT

(71) Applicant: Kabushiki Kaisha Toshiba, Minato-ku (JP)

(72) Inventors: Kenjiro Uesugi, Fuchu (JP); Jumpei Tajima, Koganei (JP); Hiroshi Ono, Setagaya (JP); Toshihide Ito, Minato (JP); Shigeya Kimura, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/693,980

(22) Filed: Apr. 23, 2015

(30) Foreign Application Priority Data

Jul. 7, 2014 (JP) .................................. 2014-139421

(51) Int. Cl.
| | |
|---|---|
| *H01L 29/207* | (2006.01) |
| *H01L 33/38* | (2010.01) |
| *H01L 33/40* | (2010.01) |
| *H01L 33/22* | (2010.01) |
| *H01L 33/62* | (2010.01) |
| *H01L 33/44* | (2010.01) |

(52) U.S. Cl.
CPC .............. *H01L 33/382* (2013.01); *H01L 33/22* (2013.01); *H01L 33/405* (2013.01); *H01L 33/44* (2013.01); *H01L 33/62* (2013.01)

(58) Field of Classification Search
None
See application file for complete search history.

(56) References Cited

U.S. PATENT DOCUMENTS

| | | | | |
|---|---|---|---|---|
| 8,421,112 | B2 * | 4/2013 | Jeong et al. | 257/99 |
| 8,445,916 | B2 * | 5/2013 | Kojima et al. | 257/76 |
| 8,450,751 | B2 | 5/2013 | Engl et al. | |
| 2009/0101923 | A1 | 4/2009 | Choi et al. | |
| 2011/0193113 | A1 | 8/2011 | Jeong et al. | |
| 2011/0220910 | A1 | 9/2011 | Kojima et al. | |
| 2014/0225141 | A1 | 8/2014 | Katsuno et al. | |

FOREIGN PATENT DOCUMENTS

| | | |
|---|---|---|
| JP | 2009-105376 | 5/2009 |
| JP | 2011-114154 | 6/2011 |
| JP | 2011-187679 | 9/2011 |
| JP | 2014-154727 | 8/2014 |

* cited by examiner

*Primary Examiner* — Jack Chen
(74) *Attorney, Agent, or Firm* — Oblon, McClelland, Maier & Neustadt, L.L.P.

(57) ABSTRACT

A semiconductor light emitting element includes a metal layer, a first semiconductor layer of a first conductivity type, a light emitting layer, a second semiconductor layer of a second conductivity type, a first electrode, a second electrode, and an insulating layer. The first semiconductor layer is separated from the metal layer in a first direction. The first semiconductor layer includes a first region, a second region, and a third region. The light emitting layer has a first side surface intersecting a second direction. The second semiconductor layer has a second side surface intersecting the second direction. The first electrode is electrically connected to the first region and the metal layer. The second electrode includes a first portion, and a second portion being continuous with the first portion. The insulating layer includes a first insulating portion and a second insulating portion.

20 Claims, 5 Drawing Sheets

SEMICONDUCTOR LIGHT EMITTING ELEMENT

CROSS-REFERENCE TO RELATED APPLICATIONS

This application is based upon and claims the benefit of priority from Japanese Patent Application No. 2014-139421, filed on Jul. 7, 2014; the entire contents of which are incorporated herein by reference.

FIELD

Embodiments described herein relate generally to a semiconductor light emitting element.

BACKGROUND

High efficiency is desirable for a semiconductor light emitting element such as a light emitting diode (LED), etc.

DETAILED DESCRIPTION

Figure 1:
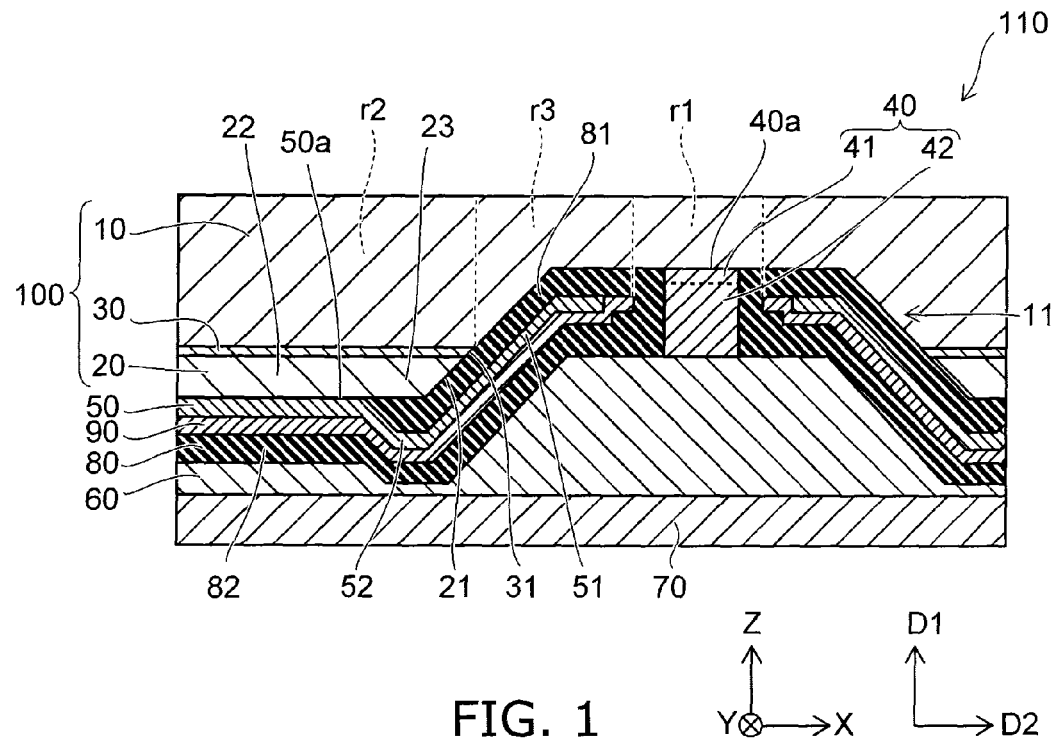
FIG. 1 is a schematic cross-sectional view showing a semiconductor light emitting element according to a first embodiment.

According to one embodiment, a semiconductor light emitting element includes a metal layer, a first semiconductor layer of a first conductivity type, a light emitting layer, a second semiconductor layer of a second conductivity type, a first electrode, a second electrode, and an insulating layer. The first semiconductor layer is separated from the metal layer in a first direction. The first semiconductor layer includes a first region, a second region separated from the first region in a second direction intersecting the first direction, and a third region provided between the first region and the second region. The light emitting layer is provided between the second region and the metal layer. The light emitting layer has a first side surface intersecting the second direction. The second semiconductor layer is provided between the light emitting layer and the metal layer. The second semiconductor layer has a second side surface intersecting the second direction. The first electrode is provided between the first region and the metal layer and electrically connected to the first region and the metal layer. The second electrode is electrically connected to the second semiconductor layer. The second electrode includes a first portion provided between the third region and the metal layer, and a second portion provided between the second region and the metal layer. The second portion is continuous with the first portion. The second semiconductor layer is provided between the light emitting layer and the second portion. The insulating layer includes a first insulating portion provided between the first portion and the third region and between the second electrode and the first side surface, and a second insulating portion is provided between the second electrode and the metal layer and between the second electrode and the first electrode.

Various embodiments of the invention will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a semiconductor light emitting element according to a first embodiment.

As shown in FIG. 1, the semiconductor light emitting element 110 according to the embodiment includes a stacked body 100, a first electrode 40, a second electrode 50, a metal layer 60, and an insulating layer 80. The stacked body 100 includes a first semiconductor layer 10, a second semiconductor layer 20, and a light emitting layer 30.

The first semiconductor layer 10 is separated from the metal layer 60 in a first direction D1.

The first direction D1 is taken as a Z-axis direction. One axis perpendicular to the Z-axis direction is taken as an X-axis direction. An axis perpendicular to the Z-axis direction and the X-axis direction is taken as a Y-axis direction.

The first semiconductor layer 10 includes a first region r1, a second region r2, and a third region r3. The second region r2 is separated from the first region r1 in a second direction D2. The second direction D2 intersects the first direction. For example, the second direction D2 may be the X-axis direction. The second direction D2 may be slightly tilted from the X-axis direction. The third region r3 is provided between the first region r1 and the second region r2.

The first semiconductor layer 10 has a first conductivity type. On the other hand, the second semiconductor layer 20 has a second conductivity type. For example, the first conductivity type is an n-type; and the second conductivity type is a p-type. The first conductivity type may be the p-type; and the second conductivity type may be the n-type. In the example hereinbelow, the first conductivity type is the n-type; and the second conductivity type is the p-type.

The light emitting layer 30 emits light (emitted light). The light emitting layer 30 is provided between the second region r2 and the metal layer 60. The light emitting layer 30 has a first side surface 31 intersecting the second direction D2.

The second semiconductor layer 20 is provided between the light emitting layer 30 and the metal layer 60. The second semiconductor layer 20 has a second side surface 21 intersecting the second direction D2.

The first semiconductor layer 10, the second semiconductor layer 20, and the light emitting layer 30 include, for example, nitride semiconductors.

For example, a gallium nitride (GaN) material that includes an n-type impurity is used as the first semiconductor layer 10. At least one of Si, Ge, Te, or Sn is used as the n-type impurity. For example, a GaN-based material that includes a p-type impurity is used as the second semiconductor layer 20. At least one of Mg, Zn, or C is used as the p-type impurity.

The stacked body 100 that includes the first semiconductor layer 10, the second semiconductor layer 20, and the light emitting layer 30 is formed by, for example, epitaxial growth. For example, a growth substrate includes a silicon substrate. The growth substrate may include one of $SiO_2$, quartz, sapphire, GaN, SiC, or GaAs. The plane orientation of the growth substrate is arbitrary.

The first electrode 40 is provided between the first region r1 and the metal layer 60. The first electrode 40 is electrically connected to the first region r1 and the metal layer 60. The first electrode 40 includes, for example, aluminum (Al). At least a surface 40a of the first electrode 40 that opposes the first region r1 is light-reflective.

The second electrode 50 is electrically connected to the second semiconductor layer 20. The second electrode 50 includes a first portion 51 that is provided between the third region r3 and the metal layer 60, and a second portion 52 that is provided between the second region r2 and the metal layer 60 and is continuous with the first portion 51. The second electrode 50 includes, for example, silver (Ag). At least a surface 50a of the second electrode that opposes the second semiconductor layer 20 is light-reflective.

For example, the second electrode 50 is formed using lift-off. For example, a film of Ag or a Ag alloy having a thickness of about 200 nm is formed as the second electrode 50 using vapor deposition. After the lift-off, the contact resistance between the second electrode 50 and the second semiconductor layer 20 is reduced by performing heat treatment of the second electrode 50 for 1 minute in a nitrogen atmosphere at about 300° C. or for 1 minute in an oxygen-nitrogen mixed atmosphere at about 300° C.

The first electrode 40 includes a first conductive portion 41 electrically connected to the first region r1. The first electrode 40 includes a second conductive portion 42 provided between the first conductive portion 41 and the metal layer 60. The second conductive portion 42 is electrically connected to the metal layer 60. In the example, the outer edge of the projection image when the first conductive portion 41 is projected onto a plane (e.g., the XY plane) perpendicular to the first direction D1 overlaps the outer edge of the projection image when the second conductive portion 42 is projected onto the XY plane. The first conductive portion 41 and the second conductive portion 42 may be formed as one body.

Specifically, for example, a portion of the second semiconductor layer 20 and the light emitting layer 30 is removed using dry etching to expose the first semiconductor layer 10. Using, for example, lift-off, the first conductive portion 41 of the first electrode 40 is formed in the region (the first region r1) where the first semiconductor layer 10 is exposed. For example, a stacked film of Al/Ta/Ti/Al/Ti having a thickness of about 300 nm is formed as the first conductive portion 41 using vapor deposition. After the lift-off, for example, the contact resistance between the first conductive portion 41 and the first semiconductor layer 10 is reduced by performing heat treatment of the first conductive portion 41 for 1 minute in a nitrogen atmosphere at about 400° C.

For example, the second conductive portion 42 is formed continuously with the first conductive portion 41 using lift-off. For example, a stacked film of Ti/Al having a thickness of about 700 nm is formed as the second conductive portion 42 using vapor deposition.

The insulating layer 80 includes a first insulating portion 81 provided between the first portion 51 and the third region r3 and between the second electrode 50 and the first side surface 31. The insulating layer 80 includes a second insulating portion 82 provided between the second electrode 50 and the metal layer 60 and between the second electrode 50 and the first electrode 40. The insulating layer 80 includes, for example, silicon oxide ($SiO_2$, etc.).

For example, a film of $SiO_2$ having a thickness of about 400 nm is formed as the first insulating portion 81 using thermal CVD (Chemical Vapor Deposition). For example, a film of $SiO_2$ having a thickness of about 600 nm is formed as the second insulating portion 82 using plasma CVD.

The second semiconductor layer 20 includes a connection portion 22 that is electrically connected to the second electrode 50, and a non-connection portion 23 that is arranged with the connection portion 22 in the second direction D2. The non-connection portion 23 is provided between the connection portion 22 and the third region r3 when projected onto a plane (e.g., the XY plane) perpendicular to the first direction D1. As shown in FIG. 1, the first insulating portion 81 may extend between the second electrode 50 and the non-connection portion 23.

The first region r1 and the third region r3 are adjacent in the description recited above. The first electrode 40 is disposed in the first region r1. The first portion 51 of the second electrode 50 is disposed in the third region r3. The second electrode 50 extends to the side surface vicinity of the first electrode 40 as viewed from the ZX cross section of FIG. 1.

The metal layer 60 is a bonding metal layer. For example, gold-tin (Au—Su) solder is used as the metal layer 60.

In the example of FIG. 1, a mesa-shaped recess 11 is made in the stacked body 100. The recess 11 is formed from the second semiconductor layer 20 toward the first semiconductor layer 10. The first electrode 40 is electrically connected to the region of the first semiconductor layer 10 exposed at the recess 11. The second electrode 50 extends to the side surface vicinity of the first electrode 40 along the side surface of the first semiconductor layer 10 formed in the recess 11.

Here, the optical reflectance of the surface 40a of the first electrode 40 opposing the first region r1 is lower than the optical reflectance of the surface 50a of the second electrode 50 opposing the second semiconductor layer 20. For example, the optical reflectance is an optical reflectance for the peak wavelength of the light emitted from the light emitting layer 30. The portion that includes the surface 40a is, for example, Al or an Al alloy. The portion that includes the surface 50a is, for example, Ag or a Ag alloy. Generally, the optical reflectance of Al is lower than the optical reflectance of Ag. Similarly to the portion including the surface 50a, it is desirable for the portion of the second electrode 50 that includes the surface opposing the first insulating portion 81 to be Ag or a Ag alloy. Thus, many Ag surfaces which are relatively highly reflective are disposed for the light emitted from the light emitting layer 30. Thereby, high efficiency is possible.

The semiconductor light emitting element 110 may further include a metal film 90. The metal film 90 is provided between the second electrode 50 and the second insulating portion 82. For example, the metal film 90 is also called a protective metal layer (a barrier metal). The metal film 90 is formed so that the reflective characteristics of the second electrode 50 are not lost when forming the second insulating portion 82. The metal film 90 is formed so that the ohmic properties between the second electrode 50 and the second semiconductor layer 20 are not lost. The metal film 90 includes, for example, at least one of titanium (Ti) or tungsten (W).

The optical reflectance of the metal film 90 for the peak wavelength of the light emitted from the light emitting layer 30 is lower than the optical reflectance of the second electrode 50 for the peak wavelength. The peak wavelength is the wavelength when the energy of the emitted light is a maximum. For example, the metal film 90 is formed using lift-off. For example, a stacked film of TiW/Pt/TiW/Pt having a thickness of about 300 nm may be formed as the metal film 90 using, for example, sputtering.

The semiconductor light emitting element 110 may further include a base unit 70. The metal layer 60 is disposed between the first semiconductor layer 10 and the base unit 70. For example, the base unit 70 is conductive. The base unit 70 may be insulative. For example, a silicon (Si) substrate having a thickness of 625 μm is used as the base unit 70.

In the specification, the state of being electrically connected includes the state in which multiple conductors are in direct contact. The state of being electrically connected includes the state in which a current flows between multiple conductors that have another conductor disposed between the multiple conductors.

For example, a first reference example has a structure in which the first portion 51 is not provided in the second electrode 50. The reflective second electrode 50 is provided only between the second semiconductor layer 20 and the metal layer 60. In such a case, a reflective layer does not exist in the region positioned between the first electrode 40 and the second electrode 50. Therefore, the light extraction efficiency is low for the light emitted from the light emitting layer 30.

A second reference example has a structure in which the first electrode 40 extends to the side surface of the second electrode 50 with the insulating layer 80 interposed. In such a case, by considering the contact resistance with the semiconductor layers, Al is used as the first electrode 40; and Ag is used as the second electrode 50. Because the reflectance of Al is lower than the reflectance of Ag, the light extraction efficiency of the second reference example is insufficient.

In the embodiment, the second electrode 50 that is more reflective than the first electrode 40 extends to the side surface vicinity of the first electrode 40. Thereby, the surface area of Ag which has high optical reflectance can be enlarged. According to the embodiment, a semiconductor light emitting element having high efficiency can be provided.

Second Embodiment

Figure 2:
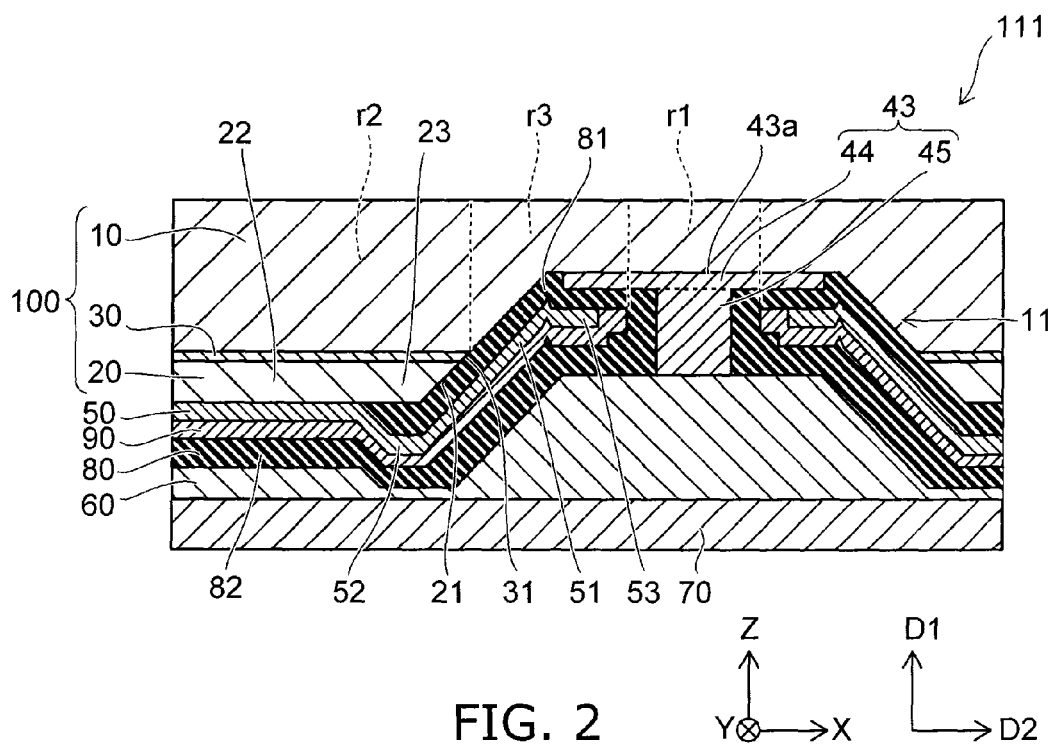
FIG. 2 is a schematic cross-sectional view showing a semiconductor light emitting element according to a second embodiment.

FIG. 2 is a schematic cross-sectional view showing a semiconductor light emitting element according to a second embodiment.

As shown in FIG. 2, the semiconductor light emitting element 111 according to the embodiment includes the stacked body 100, a first electrode 43, the second electrode 50, the metal layer 60, the insulating layer 80, and the metal film 90. The stacked body 100 includes the first semiconductor layer 10 of the first conductivity type, the second semiconductor layer 20 of the second conductivity type, and the light emitting layer 30.

At least a surface 43a of the first electrode 43 that opposes the first region r1 is light-reflective. The first electrode 43 includes a first conductive portion 44. The first electrode 43 includes a second conductive portion 45 provided between the first conductive portion 44 and the metal layer 60. The outer edge when the first conductive portion 44 is projected onto a plane (e.g., the XY plane) perpendicular to the first direction D1 is positioned outside the outer edge when the second conductive portion 45 is projected onto the XY plane. More specifically, the first electrode 43 has a configuration such that the ZX cross section of FIG. 2 is T-shaped; and the first conductive portion 44 is electrically connected to the first region r1 and the third region r3.

Similarly to the first embodiment, the optical reflectance of the surface 43a of the first electrode 43 opposing the first region r1 is lower than the optical reflectance of the surface 50a of the second electrode 50 opposing the second semiconductor layer 20. The portion that includes the surface 43a is, for example, Al or an Al alloy. The portion that includes the surface 50a is, for example, Ag or a Ag alloy. Similarly to the portion that includes the surface 50a, it is desirable for the portion that includes the surface of the second electrode 50 opposing the first insulating portion 81 to be Ag or a Ag alloy. Thus, many Ag surfaces that are relatively highly reflective are disposed for the light emitted from the light emitting layer 30. Thereby, high efficiency is possible.

In the first and second reference examples described above, the metal film (the barrier metal) 90 that covers the end portion (the side surface) of the second electrode 50 is exposed on the element surface side. Therefore, the metal film 90 that is exposed may undesirable absorb the light emitted from the light emitting layer 30 and reduce the optical reflectance.

In the embodiment, the second electrode 50 further includes a third portion 53 that is continuous with the first portion 51. The first portion 51 is disposed between the third portion 53 and the second portion 52. The third portion 53 extends between the first conductive portion 44 and the metal layer 60. As shown in FIG. 2, the projection image when the first conductive portion 44 is projected onto the XY plane overlaps the projection image when the third portion 53 of the second electrode 50 is projected onto the XY plane. That is, in the embodiment, the first conductive portion 44 of the first electrode 43 is formed to overlap the third portion 53 of the second electrode 50 in the first direction D1 so that the metal film 90 that covers the third portion 53 of the second electrode 50 is not exposed.

Thus, according to the embodiment, the second electrode that is relatively highly reflective extends to the side surface vicinity of the first electrode; and the exposure of the metal film (the barrier metal) can be prevented by the first electrode. Thereby, the optical reflectance can be increased; and the light absorption can be suppressed. Thereby, a semiconductor light emitting element having higher efficiency can be provided.

Third Embodiment

Figure 3:
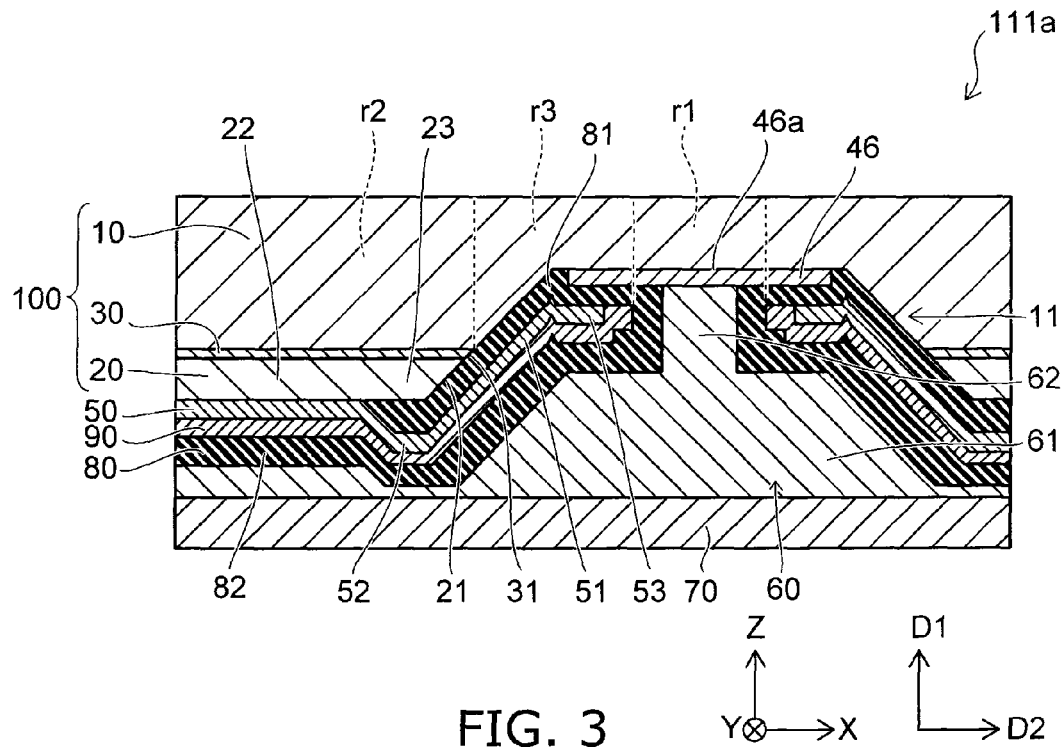
FIG. 3 is a schematic cross-sectional view showing a semiconductor light emitting element according to a third embodiment.

FIG. 3 is a schematic cross-sectional view showing a semiconductor light emitting element according to a third embodiment.

The semiconductor light emitting element 111a according to the embodiment includes a first electrode 46 and the metal layer 60. The metal layer 60 includes a planar portion 61. The metal layer 60 includes an intermediate portion 62 that extends from the planar portion 61 and is electrically connected to the first electrode 46. The planar portion 61 is disposed along a plane (e.g., the XY plane) perpendicular to the first direction D1. The intermediate portion 62 is provided between the planar portion 61 and the first electrode 46 and overlaps a portion of the first semiconductor layer 10 when projected onto a plane including the first direction D1.

In the example of FIG. 2, the first electrode 43 includes the first conductive portion 44 and the second conductive portion 45. The first electrode 43 has a configuration having a T-shaped cross section. In the example, the first electrode 46 has a flat plate configuration. For example, the material and configuration of the first electrode 46 may be the same as the material and configuration of the first conductive portion 44. For example, the first electrode 46 includes Al; and at least a surface 46a that opposes the first region r1 is set to be reflective.

The first electrode 46 is electrically connected to the intermediate portion 62. The intermediate portion 62 and the planar portion 61 may be provided as one body. It is favorable for the planar portion 61 and the intermediate portion 62 to include the same material or materials having substantially the same characteristics. In the case where the material of the first electrode 46 and the material of the intermediate portion 62 are different, it is favorable to provide a barrier metal layer (not shown) to protect the first electrode 46.

Fourth Embodiment

Figure 4:
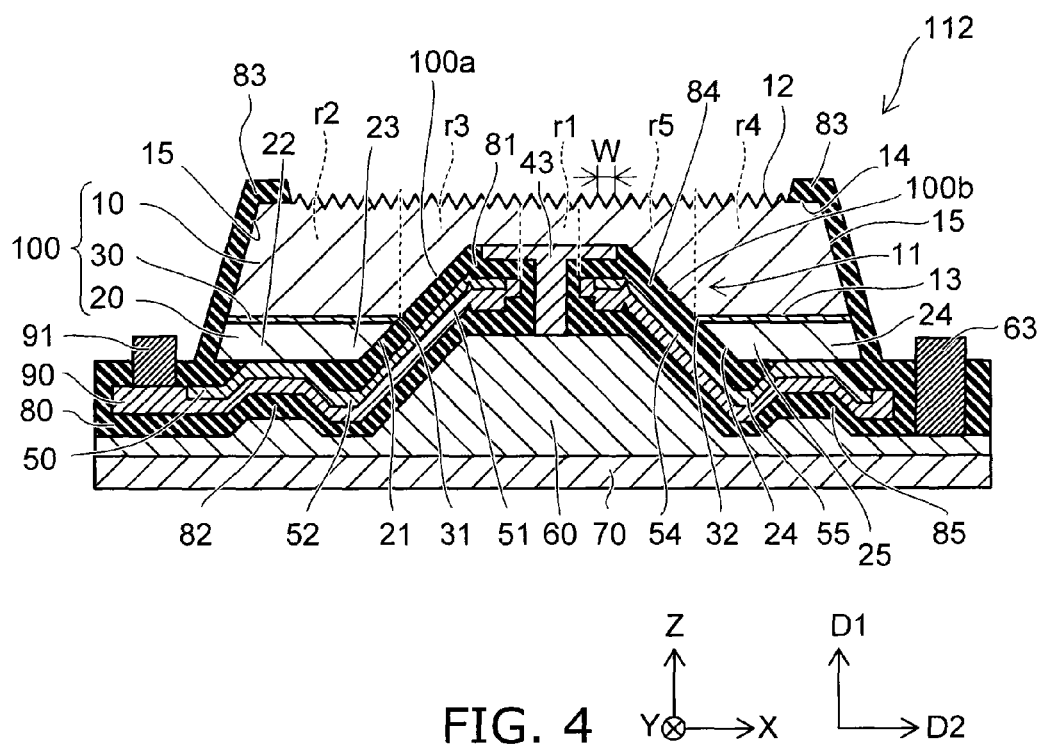
FIG. 4 is a schematic cross-sectional view showing a semiconductor light emitting element according to a fourth embodiment.

FIG. 4 is a schematic cross-sectional view showing a semiconductor light emitting element according to a fourth embodiment.

FIG. 4 shows a structure in the case where the base unit 70 of the second embodiment is insulative.

The semiconductor light emitting element 112 according to the embodiment further includes a first pad 63 electrically connected to the first electrode 43. The projection image of the first pad 63 when the first pad 63 is projected onto a plane (e.g., the XY plane) perpendicular to the first direction D1 overlaps the projection image of the metal layer 60 when projected onto the XY plane but does not overlap the projection image of the first semiconductor layer 10 when projected onto the XY plane. In other words, the first pad 63 is disposed outside the stacked body 100 and is electrically connected to the first electrode 43 via the metal layer 60.

Specifically, a portion of the insulating layer 80 is removed to expose the metal layer 60. The first pad 63 is formed on the metal layer 60 that is exposed using, for example, lift-off. For example, a stacked body of Ti/Pt/Au having a thickness of about 500 nm is formed as the first pad 63 using vapor deposition.

The semiconductor light emitting element 112 further includes a second pad 91 electrically connected to the second electrode 50. The projection image of the second pad 91 when the second pad 91 is projected onto a plane (e.g., the XY plane) perpendicular to the first direction D1 overlaps the projection image when the metal layer 60 is projected onto the XY plane but does not overlap the projection image when the first semiconductor layer 10 is projected onto the XY plane. In other words, the second pad 91 is disposed outside the stacked body 100 and is connected to the second electrode 50 via the metal film 90.

Specifically, a portion of the insulating layer 80 is removed to expose the metal film 90. Using lift-off, the second pad 91 is formed on the metal film 90 that is exposed. For example, a stacked body of Ti/Pt/Au having a thickness of about 500 nm is formed as the second pad 91 using vapor deposition.

The configuration of the second pad 91 is, for example, a polygon (a quadrilateral or higher), a circle, a flattened circle, etc. For example, a bonding wire is connected to the second pad 91.

The first semiconductor layer 10 may include a first surface 13 on the light emitting layer 30 side, a second surface 14 on the side opposite to the first surface 13, and an unevenness 12 provided in the second surface 14. A width W in the second direction D2 of the protrusions of the unevenness 12 is not less than the peak wavelength of the light emitted from the light emitting layer 30. The peak wavelength of the emitted light is, for example, not less than 400 nm and not more than 650 nm. However, in the embodiment, the peak wavelength is arbitrary.

A sidewall insulating layer 83 that is a protective film is formed on a side wall 15 of the stacked body 100. For example, a film of silicon oxide ($SiO_2$, etc.) is formed as the sidewall insulating layer 83 using sputtering.

Fifth Embodiment

Figure 5:
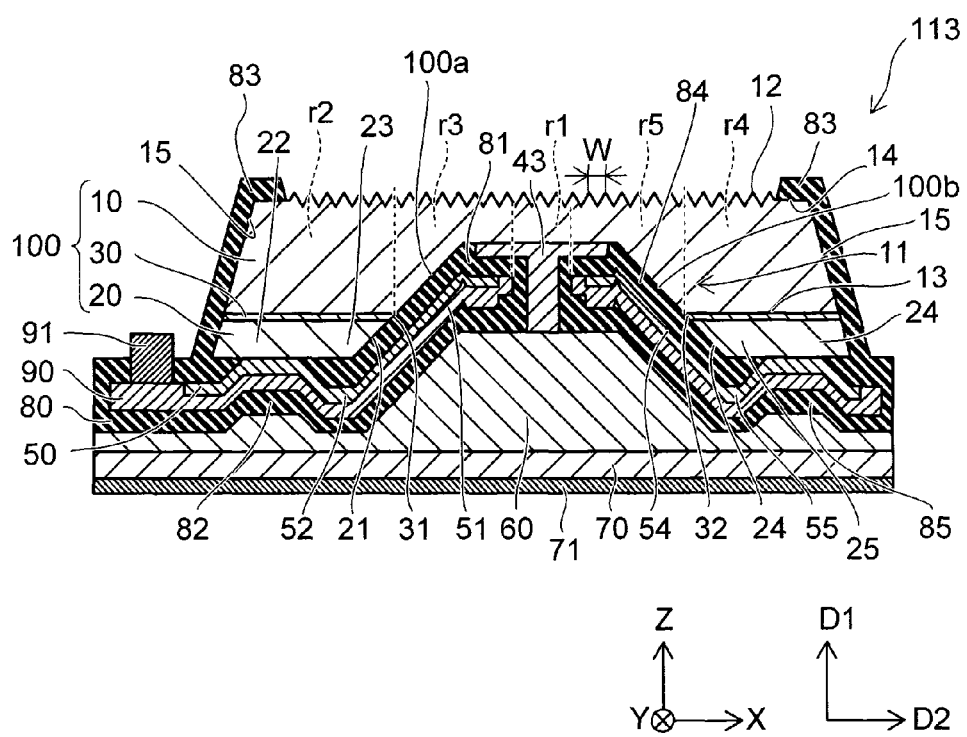
FIG. 5 is a schematic cross-sectional view showing a semiconductor light emitting element according to a fifth embodiment.

FIG. 5 is a schematic cross-sectional view showing a semiconductor light emitting element according to a fifth embodiment.

FIG. 5 shows a structure in the case where the base unit 70 of the second embodiment is conductive.

The semiconductor light emitting element 113 according to the embodiment further includes a third electrode 71. The base unit 70 is disposed between the metal layer 60 and the third electrode 71. The first electrode 43 (FIG. 2) is electrically connected to the third electrode 71 via the metal layer 60 and the conductive base unit 70.

The semiconductor light emitting element 113 further includes the second pad 91 that is electrically connected to the second electrode 50. The projection image of the second pad 91 when the second pad 91 is projected onto a plane (e.g., the XY plane) perpendicular to the first direction D1 overlaps the projection image when the metal layer 60 is projected onto the XY plane but does not overlap the projection image when the first semiconductor layer 10 is projected onto the XY plane. In other words, the second pad 91 is disposed outside the stacked body 100 and is connected to the second electrode 50 via the metal film 90.

Specifically, a portion of the insulating layer 80 is removed to expose the metal film 90. Using, for example, lift-off, the second pad 91 is formed on the metal film 90 that is exposed. For example, a stacked body of Ti/Pt/Au having a thickness of about 500 nm is formed as the second pad 91 using vapor deposition.

For example, the base unit 70 is polished to have a thickness of about 200 μm. The third electrode 71 is formed on the polishing surface of the base unit 70. For example, a stacked film of Ti/Pt/Au having a thickness of about 500 nm is formed as the third electrode 71 using vapor deposition.

The first semiconductor layer 10 may include the first surface 13 on the light emitting layer 30 side, the second surface 14 on the side opposite to the first surface 13, and the unevenness 12 provided in the second surface 14. The width W in the second direction D2 of the protrusions of the unevenness 12 is not less than the peak wavelength of the light emitted from the light emitting layer 30.

The sidewall insulating layer 83 that is a protective film is formed on the side wall 15 of the stacked body 100. For example, a film of silicon oxide ($SiO_2$, etc.) is formed as the sidewall insulating layer 83 using sputtering.

Here, in FIG. 4 and FIG. 5, the first semiconductor layer 10 may further include a fourth region r4 that is separated from the first region r1 in the second direction D2, and a fifth region r5 that is provided between the first region r1 and the fourth region r4. The first region r1 is provided between the third region r3 and the fifth region r5. That is, the first semiconductor layer 10 further includes the fourth region r4 and the fifth region r5 that are arranged in the second direction D2. The first region r1 is provided between the third region r3 and the fifth region r5. The fifth region r5 is provided between the first region r1 and the fourth region r4.

The light emitting layer 30 includes a third side surface 32 that is provided between the fourth region r4 and the metal layer 60 and intersects the second direction D2. The second semiconductor layer 20 includes a fourth side surface 24 that is provided between the light emitting layer 30 and the metal layer 60 and intersects the second direction D2.

The second electrode 50 includes a fourth portion 54 that is provided between the fifth region r5 and the metal layer 60, and a fifth portion 55 that is provided between the fourth region r4 and the metal layer 60 and is continuous with the fourth portion 54.

The insulating layer 80 includes a third insulating portion 84 that is provided between the fourth portion 54 and the fifth region r5 and between the second electrode 50 and the third side surface 32, and a fourth insulating portion 85 that is provided between the second electrode 50 and the metal layer 60 and between the second electrode 50 and the first electrode 40.

In other words, the stacked structure that includes the second region r2 and the third region r3 and the stacked structure that includes the fourth region r4 and the fifth region r5 are disposed to be symmetric around the first region r1.

The third region r3 includes a fifth side surface 100a that is tilted with respect to the second direction D2. The fifth region r5 includes a sixth side surface 100b that is tilted with respect to the second direction D2. In other words, the recess 11 that is mesa-shaped is formed in the stacked body 100; and the insulating layer 80, the first electrode 43, the second electrode 50, the metal film 90, the metal layer 60, and the base unit 70 are formed for the recess 11.

An example of a method for manufacturing the semiconductor light emitting element according to the embodiment will now be described.

Figure 6:
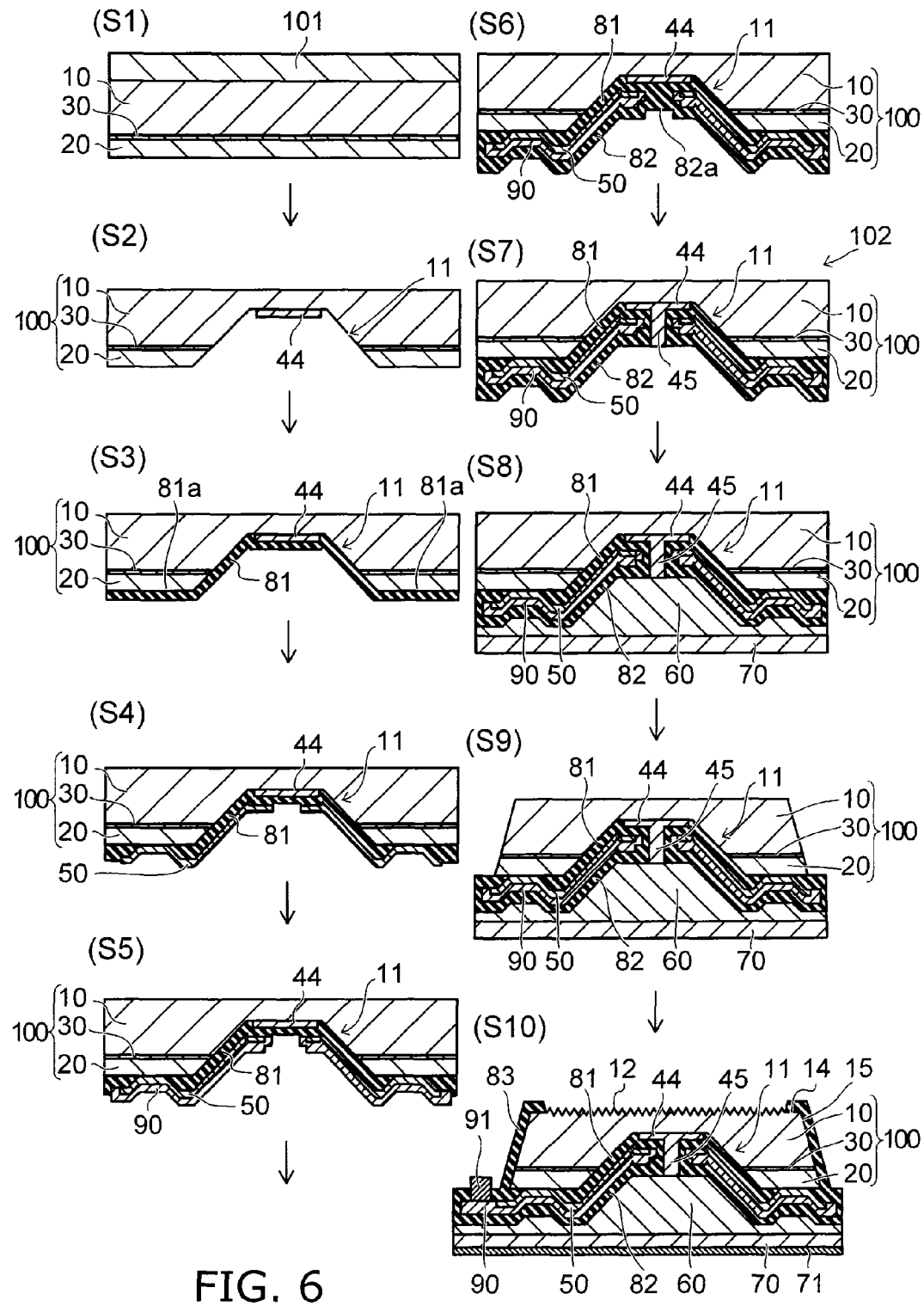
FIG. 6 shows schematic cross-sectional views in order of the processes, showing the method for manufacturing the semiconductor light emitting element according to the fifth embodiment.

FIG. 6 shows schematic cross-sectional views in order of the processes, showing the method for manufacturing the semiconductor light emitting element according to the fifth embodiment.

A buffer layer (not shown) is formed on a growth substrate 101; and the first semiconductor layer 10, the light emitting layer 30, and the second semiconductor layer 20 are sequentially formed in this order on the buffer layer (step S1). The formation of these layers may include, for example, metal-organic chemical vapor deposition (MOCVD), metal-organic vapor phase epitaxy (MOVPE), molecular beam epitaxy (MBE), hydride vapor phase epitaxy (HVPE), etc. These layers are epitaxially grown. The growth substrate 101 may include, for example, a substrate of silicon, sapphire, spinel, GaAs, InP, ZnO, Ge, SiGe, SiC, etc. A description of the growth substrate 101 is omitted from the following steps.

The recess 11 is made by removing a portion of the first semiconductor layer 10, a portion of the light emitting layer 30, and a portion of the second semiconductor layer 20 in a mesa shape. Thereby, the stacked body 100 is formed in which the mesa-shaped recess 11 is provided. For example, the patterning of the removal includes RIE (Reactive Ion Etching) which is one type of dry etching. For example, a gas including chlorine is used in the RIE. Using, for example, lift-off, the first conductive portion 44 of the first electrode 43 is formed in a partial region where the first semiconductor layer 10 is exposed (step S2). For example, a stacked film of Al/Ta/Ti/Al/Ti having a thickness of about 300 nm is formed as the first conductive portion 44 using vapor deposition. After the lift-off, the contact resistance between the first conductive portion 44 and the first semiconductor layer 10 is reduced by, for example, performing heat treatment of the first conductive portion 44 for 1 minute in a nitrogen atmosphere at about 400° C.

The first insulating portion 81 of the insulating layer 80 is formed on the stacked body 100 on which the first conductive portion 44 is formed (step S3). The first insulating portion 81 is formed on the entire surface including the recess 11 using, for example, thermal CVD, sputtering, SOG (Spin On Glass), etc. For example, the first insulating portion 81 is formed of a film of $SiO_2$. The thickness of the film is, for example, about 400 nm. A portion 81a of the first insulating portion 81 is removed to expose a partial region of the second semiconductor layer 20.

The second electrode 50 is formed on the first insulating portion 81 (step S4). At this time, the second electrode 50 is electrically connected to the partial region where the second semiconductor layer 20 is exposed. For example, the second electrode 50 is formed by lift-off. For example, a film of Ag or a Ag alloy having a thickness of about 200 nm is formed as the second electrode 50 using vapor deposition. After the lift-off, the contact resistance between the second electrode 50 and the second semiconductor layer 20 is reduced by performing heat treatment of the second electrode 50 for 1 minute in a nitrogen atmosphere at about 300° C. or for 1 minute in an oxygen-nitrogen mixed atmosphere at about 300° C.

The metal film 90 is formed on the second electrode 50 (step S5). For example, the metal film 90 is formed using lift-off. For example, a stacked film of TiW/Pt/TiW/Pt having a thickness of about 300 nm is formed as the metal film 90 using sputtering.

The second insulating portion 82 of the insulating layer 80 is formed on the metal film 90 (step S6). The second insulating portion 82 is formed on the entire surface including the recess 11 using, for example, plasma CVD, etc. For example, the second insulating portion 82 is formed of a film of $SiO_2$. The thickness of the film is, for example, about 600 nm. A portion 82a that includes a portion of the second insulating portion 82 and a portion of the first insulating portion 81 is removed to expose a partial region of the first conductive portion 44.

The second conductive portion 45 of the first electrode 43 is formed on the exposed partial region of the first conductive portion 44 (step S7). For example, the second conductive portion 45 is formed by lift-off. For example, a stacked film of Ti/Al having a thickness of about 700 nm is formed as the second conductive portion 45 using vapor deposition. At this time, for example, a stacked film of Ti/Au having a thickness of about 150 nm is formed on the entire surface including the second conductive portion 45 and the second insulating portion 82 as a not-shown first intermediate metal layer using vapor deposition to form a patterning body 102.

The base unit 70 on which a not-shown second intermediate metal layer is provided is bonded to the patterning body 102 (step S8). The first intermediate metal layer and the second intermediate metal layer are bonded to each other to form the metal layer 60. The base unit 70 includes, for example, a Si substrate having a thickness of about 625 µm. The second intermediate metal layer includes, for example, Au—Sn solder. The first intermediate metal layer of the patterning body 102 and the second intermediate metal layer of the base unit 70 are caused to oppose each other; and the base unit 70 and the patterning body 102 are bonded to each other by the intermediate metal layers. For example, the bonding is performed by thermal compression bonding.

The growth substrate 101 (not shown) is removed; and the elements are separated (step S9). In the case where a sapphire substrate is used as the growth substrate 101, for example, laser lift-off is used. In the case where a Si substrate is used as the growth substrate 101, the removal is performed by, for example, polishing and dry etching. These methods may be implemented in combination. For example, in the case where laser lift-off is used, the growth substrate 101 and the semiconductor layer (the element) are separated by decomposing a portion of the GaN of the semiconductor layer by irradiating laser light.

The unevenness 12 is formed in the second surface (the front surface) 14 of the first semiconductor layer 10 using, for example, dry etching (step S10).

In step S10, the sidewall insulating layer 83 which is a sidewall protective layer is formed on the second surface 14 and the side wall 15 of the stacked body 100 using, for example, sputtering. A portion of the sidewall insulating layer 83 is removed to expose the second surface 14 of the first semiconductor layer 10. The unevenness 12 is formed in the second surface 14 that is exposed.

A portion of the sidewall insulating layer 83 and a portion of the insulating layer 80 (the first insulating portion 81) are removed to expose the metal film 90. The second pad 91 is formed on the metal film 90 that is exposed using, for example, lift-off. For example, a stacked body of Ti/Pt/Au having a thickness of about 500 nm is formed as the second pad 91 using vapor deposition.

For example, the base unit 70 is polished to a thickness of about 200 μm. The third electrode 71 is formed on the polishing surface of the base unit 70. For example, a stacked film of Ti/Pt/Au having a thickness of about 500 nm is formed as the third electrode 71 using vapor deposition.

Thus, the semiconductor light emitting element 113 according to the fifth embodiment (FIG. 5) is manufactured. The basic flow is similar to the method for manufacturing the semiconductor light emitting element 112 according to the fourth embodiment.

Figure 7:
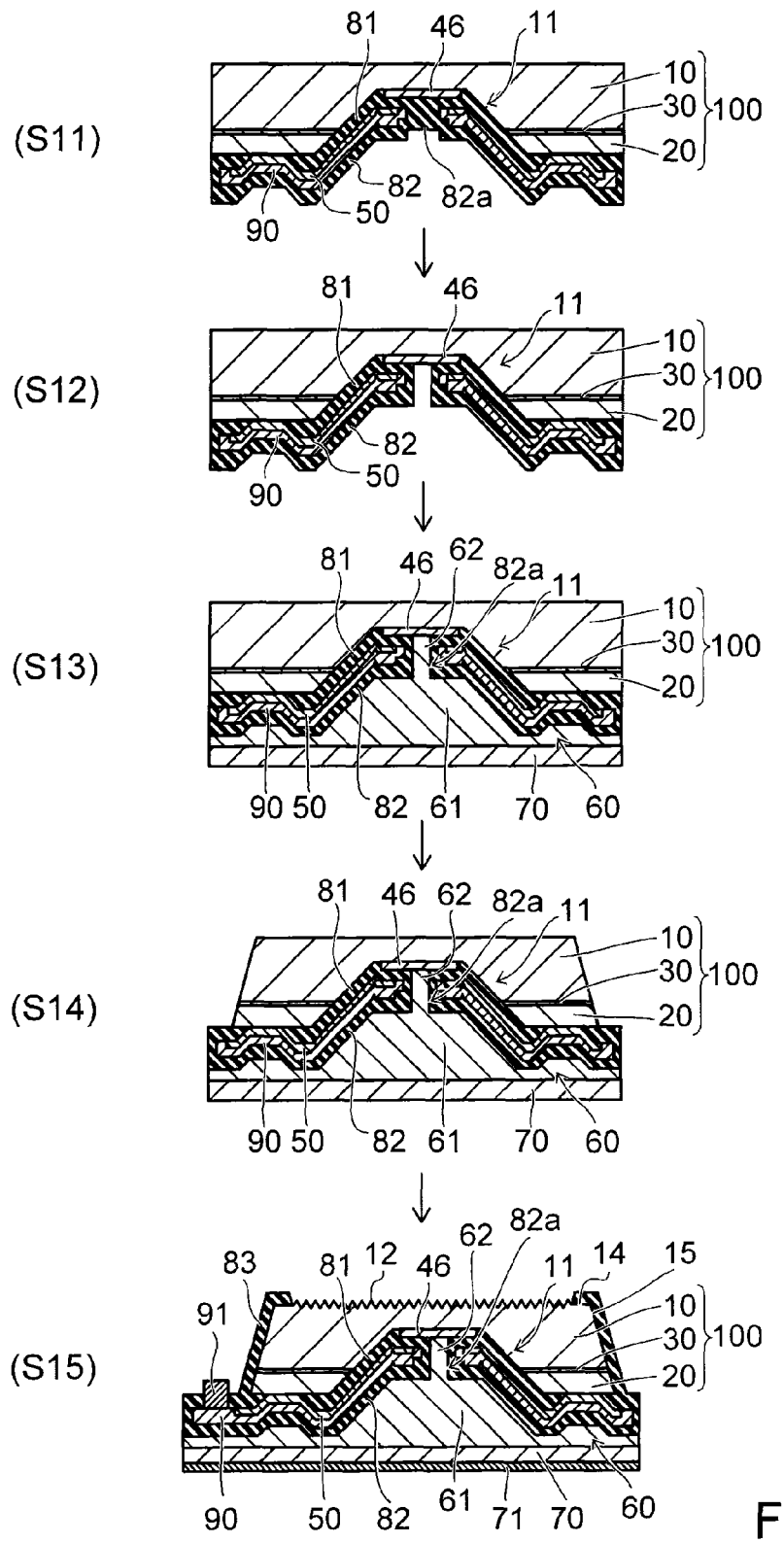
FIG. 7 shows schematic cross-sectional views in order of the processes, showing the method for manufacturing the semiconductor light emitting element according to the third embodiment.

FIG. 7 shows schematic cross-sectional views in order of the processes, showing the method for manufacturing the semiconductor light emitting element according to the third embodiment.

In the embodiment, the structures of the first electrode 46 and the metal layer 60 shown in FIG. 3 are employed. In the embodiment, step S1 to step S5 are the same as those of FIG. 6; and a description is therefore omitted. As shown in FIG. 3, for example, the first electrode 46 has a flat plate configuration. The first electrode 46 includes, for example, Al; and at least the surface 46a that opposes the first semiconductor layer 10 is set to be reflective.

The second insulating portion 82 of the insulating layer 80 is formed on the metal film 90 (step S11). The second insulating portion 82 is formed on the entire surface including the recess 11 using, for example, plasma CVD, etc. For example, the second insulating portion 82 is formed of a film of $SiO_2$. The thickness of the film is, for example, about 600 nm.

The portion 82a that includes a portion of the second insulating portion 82 and a portion of the first insulating portion 81 is removed to expose a partial region of the first electrode 46 (step S12).

The metal layer 60 is formed on the second insulating portion 82 that includes the exposed partial region of the first electrode 46 (step S13). As shown in FIG. 3, the metal layer 60 includes the planar portion 61 and the intermediate portion 62. The first electrode 46 is electrically connected to the intermediate portion 62.

Although the subsequent processes are similar to those of the example of FIG. 6, the growth substrate 101 (not shown) is removed; and the elements are separated (step S14). For example, in the case where laser lift-off is used, the growth substrate 101 and the semiconductor layer (the element) are separated by decomposing a portion of the GaN of the semiconductor layer by irradiating laser light.

The unevenness 12 is formed in the second surface (the front surface) 14 of the first semiconductor layer 10 using, for example, dry etching (step S15).

In step S15, the sidewall insulating layer 83 which is a sidewall protective layer is formed on the second surface 14 and the side wall 15 of the stacked body 100 using, for example, sputtering. A portion of the sidewall insulating layer 83 is removed to expose the second surface 14 of the first semiconductor layer 10. The unevenness 12 is formed in the second surface 14 that is exposed.

A portion of the sidewall insulating layer 83 and a portion of the insulating layer 80 (the first insulating portion 81) are removed to expose the metal film 90. Using, for example, lift-off, the second pad 91 is formed on the metal film 90 that is exposed. For example, a stacked body of Ti/Pt/Au having a thickness of about 500 nm is formed as the second pad 91 using vapor deposition.

For example, the base unit 70 is polished to a thickness of about 200 μm. The third electrode 71 is formed on the polishing surface of the base unit 70. For example, a stacked film of Ti/Pt/Au having a thickness of about 500 nm is formed as the third electrode 71 using vapor deposition.

According to the embodiment, a semiconductor light emitting element having high efficiency can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, embodiments of the invention are described with reference to specific examples. However, the invention is not limited to these specific examples. For example, one skilled in the art may similarly practice the invention by appropriately selecting specific configurations of components such as the first semiconductor layer, the light emitting layer, the second semiconductor layer, the first electrode, the second electrode, the insulating layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor light emitting elements practicable by an appropriate design modification by one skilled in the art based on the semiconductor light emitting elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
a metal layer;
a first semiconductor layer of a first conductivity type separated from the metal layer in a first direction, the first semiconductor layer including
a first region,
a second region separated from the first region in a second direction intersecting the first direction, and
a third region provided between the first region and the second region;
a light emitting layer provided between the second region and the metal layer, the light emitting layer having a first side surface intersecting the second direction;
a second semiconductor layer of a second conductivity type provided between the light emitting layer and the metal layer, the second semiconductor layer having a second side surface intersecting the second direction;
a first electrode provided between the first region and the metal layer and electrically connected to the first region and the metal layer;
a second electrode electrically connected to the second semiconductor layer, the second electrode including
a first portion provided between the third region and the metal layer, and
a second portion provided between the second region and the metal layer, the second portion being continuous with the first portion, the second semiconductor layer being provided between the light emitting layer and the second portion; and
an insulating layer including
a first insulating portion provided between the first portion and the third region and between the second electrode and the first side surface, and
a second insulating portion provided between the second electrode and the metal layer and between the second electrode and the first electrode.

2. The element according to claim 1, wherein
the first electrode has a surface opposing the first region,
the second electrode has a surface opposing the second semiconductor layer, and
an optical reflectance of the surface of the second electrode for a peak wavelength of light emitted from the light emitting layer is higher than an optical reflectance of the surface of the first electrode for the peak wavelength.

3. The element according to claim 2, wherein
a portion of the first electrode including the surface of the first electrode includes aluminum, and
a portion of the second electrode including the surface of the second electrode includes silver.

4. The element according to claim 1, further comprising a metal film provided between the second electrode and the second insulating portion.

5. The element according to claim 4, wherein an optical reflectance of the second electrode for a peak wavelength of light emitted from the light emitting layer is higher than an optical reflectance of the metal film for the peak wavelength.

6. The element according to claim 4, wherein the metal film includes at least one of titanium or tungsten.

7. The element according to claim 1, wherein
the second semiconductor layer includes:
a connection portion; and
a non-connection portion provided between the connection portion and the third region when projected onto a plane perpendicular to the first direction, and the first insulating portion extends between the second electrode and the non-connection portion.

8. The element according to claim 1, wherein
the first electrode includes:
a first conductive portion; and
a second conductive portion provided between the first conductive portion and the metal layer, and
an outer edge of the first conductive portion when projected onto a plane perpendicular to the first direction overlaps an outer edge of the second conductive portion when projected onto the plane.

9. The element according to claim 1, wherein
the first electrode includes:
a first conductive portion; and
a second conductive portion provided between the first conductive portion and the metal layer, and
an outer edge of the first conductive portion when projected onto a plane perpendicular to the first direction is positioned outside an outer edge of the second conductive portion when projected onto the plane.

10. The element according to claim 9, wherein
the second electrode further includes a third portion continuous with the first portion,
the first portion is disposed between the third portion and the second portion, and
the third portion extends between the first conductive portion and the metal layer.

11. The element according to claim 1, wherein
the metal layer includes:
a planar portion provided along a plane perpendicular to the first direction; and
an intermediate portion provided between the planar portion and the first electrode, the intermediate portion overlapping a portion of the first semiconductor layer when projected onto a plane including the first direction.

12. The element according to claim 1, further comprising a base unit,
the metal layer being disposed between the first semiconductor layer and the base unit.

13. The element according to claim 12, further comprising a first pad electrically connected to the first electrode,
the first pad overlapping the metal layer but not overlapping the first semiconductor layer when projected onto a plane perpendicular to the first direction.

14. The element according to claim 13, further comprising a second pad electrically connected to the second electrode,
the second pad overlapping the metal layer but not overlapping the first semiconductor layer when projected onto the plane.

15. The element according to claim 12, further comprising a third electrode,
the base unit being disposed between the metal layer and the third electrode,
the base unit being conductive,
the first electrode being electrically connected to the third electrode via the metal layer and the base unit.

16. The element according to claim 15, further comprising a second pad electrically connected to the second electrode,
the second pad overlapping the metal layer but not overlapping the first semiconductor layer when projected onto a plane perpendicular to the first direction.

17. The element according to claim 1, wherein
the first semiconductor layer further includes:
a fourth region separated from the first region in the second direction; and
a fifth region provided between the first region and the fourth region,
the first region is provided between the third region and the fifth region, the light emitting layer has a third side surface provided between the fourth region and the metal layer, the third side surface intersecting the second direction, the second semiconductor layer has a fourth side surface provided between the light emitting layer and the metal layer, the fourth side surface intersecting the second direction, the second electrode includes:
- a fourth portion provided between the fifth region and the metal layer; and
- a fifth portion provided between the fourth region and the metal layer, the fifth portion being continuous with the fourth portion, and the insulating layer includes:
- a third insulating portion provided between the fourth portion and the fifth region and between the second electrode and the third side surface; and
- a fourth insulating portion provided between the second electrode and the metal layer and between the second electrode and the first electrode.

18. The element according to claim 17, wherein the third region has a fifth side surface tilted with respect to the first direction, and the fifth region has a sixth side surface tilted with respect to the first direction.

19. The element according to claim 1, wherein the first semiconductor layer has:
- a first surface opposing the light emitting layer;
- a second surface on a side opposite to the first surface; and
- an unevenness provided in the second surface, and
- a width in the second direction of a protrusion of the unevenness is not less than a peak wavelength of light emitted from the light emitting layer.

20. The element according to claim 1, wherein the insulating layer includes silicon oxide.

* * * * *